(12) United States Patent
Kang

(10) Patent No.: US 9,991,344 B2
(45) Date of Patent: Jun. 5, 2018

(54) SILICON CARBIDE EPI WAFER AND METHOD FOR MANUFACTURING SAME

(71) Applicant: LG INNOTEK CO., LTD., Seoul (KR)

(72) Inventor: Seok Min Kang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days. days.

(21) Appl. No.: 15/502,055

(22) PCT Filed: Jul. 31, 2015

(86) PCT No.: PCT/KR2015/008063
§ 371 (c)(1),
(2) Date: Feb. 6, 2017

(87) PCT Pub. No.: WO2016/021886
PCT Pub. Date: Feb. 11, 2016

(65) Prior Publication Data
US 2017/0229547 A1 Aug. 10, 2017

(30) Foreign Application Priority Data
Aug. 6, 2014 (KR) .......... 10-2014-0100981

(51) Int. Cl.
*H01L 29/15* (2006.01)
*H01L 29/16* (2006.01)
*H01L 21/02* (2006.01)

(52) U.S. Cl.
CPC ...... *H01L 29/1608* (2013.01); *H01L 21/0262* (2013.01); *H01L 21/02529* (2013.01)

(58) Field of Classification Search
CPC .......... H01L 29/1608; H01L 21/02529; H01L 21/0262
See application file for complete search history.

(56) References Cited

U.S. PATENT DOCUMENTS 6,821,340 B2 11/2004 Nagasawa et al.
2015/0108504 A1* 4/2015 Watanabe ......... H01L 21/02447
257/77

FOREIGN PATENT DOCUMENTS

JP 2003092263 A 3/2003
KR 1020120132531 A 12/2012
(Continued)

OTHER PUBLICATIONS

International Search Report in International Application No. PCT/KR2015/008063, filed Jul. 31, 2015.

*Primary Examiner* — Victor A Mandala
*Assistant Examiner* — Colleen E Snow
(74) *Attorney, Agent, or Firm* — Saliwanchik, Lloyd & Eisenschenk

(57) ABSTRACT

An embodiment provides: a method for manufacturing a silicon carbide epi wafer, the method comprising the steps of preparing a wafer, applying a reaction gas to the wafer, heating the reaction gas to generate an intermediate compound, and forming a silicon carbide epi layer on the wafer using the generated intermediate compound, wherein the reaction gas contains a plurality of hydrocarbon compounds; and a silicon carbide epi wafer comprising a silicon carbide epi layer formed by a reaction gas containing a plurality of hydrocarbon compounds, wherein the C/Si value of the silicon carbide epi layer is uniform on the wafer, and thus the uniformity of the silicon carbide epi layer on the wafer can be improved.

7 Claims, 6 Drawing Sheets

(56) References Cited

FOREIGN PATENT DOCUMENTS

| | | |
|---|---|---|
| KR | 20130070480 A | 6/2013 |
| KR | 1020130070482 A | 6/2013 |
| KR | 20140070015 A | 6/2014 |
| WO | WO-2013115711 A2 | 8/2013 |

* cited by examiner

SILICON CARBIDE EPI WAFER AND METHOD FOR MANUFACTURING SAME

CROSS-REFERENCE TO RELATED APPLICATION

This application is the U.S. national stage application of International Patent Application No. PCT/KR2015/008063, filed Jul. 31, 2015, which claims priority to Korean Application No. 10-2014-0100981, filed Aug. 6, 2014, the disclosures of each of which are incorporated herein by reference in their entirety.

TECHNICAL FIELD

Embodiments relate to a silicon carbide epi wafer and a method of manufacturing the same.

BACKGROUND ART

Silicon carbide (SiC) has excellent heat resistance and mechanical strength and is physically and chemically stable, thus being widely used as an eco-friendly semiconductor material. In addition, recently, the demand for silicon carbide (SiC) substrates as substrates for electronic devices is increasing.

For a silicon carbide (SiC) wafer, reactive gas serving as a source for silicon (Si) and carbon (C) is supplied onto a wafer to induce chemical reaction, thereby forming a silicon carbide epi layer. In general, chemical vapor deposition (CVD) is commonly used to form a thin film on a wafer.

In particular, $SiH_4$ (silane), $C_2H_4$ (ethylene), $C_3H_8$ (propane) and the like are used as reactive gases for a silicon carbide wafer and such a deposition process is conducted based on the principle that reactive gas is decomposed at high temperatures, resulting in chemical reaction.

A hydrocarbon compound used as a carbon source is thermally decomposed during high-temperature deposition and the time of exposure to the high temperature process is varied depending on the distance from the point, where the source gas is supplied, to the wafer on which the source gas is deposited, which affects reactivity of the reactive gas deposited on the wafer.

Accordingly, the C/Si value of the silicon carbide epi layer formed on the wafer is changed depending on the position of the wafer, physical properties of the silicon carbide epi wafer are non-uniform and thus performance of the wafer may be disadvantageously deteriorated.

DISCLOSURE

Technical Problem

Embodiments provide a silicon carbide epi wafer including a silicon carbide epi layer with uniform C/Si, thickness and surface roughness, formed on a wafer, and a method of manufacturing the silicon carbide epi wafer.

Technical Solution

In one embodiment, a silicon carbide epi wafer includes a silicon carbide epi layer formed from a reactive gas including a plurality of hydrocarbon compounds, wherein the silicon carbide epi layer has a uniform C/Si value throughout the wafer.

A ratio of C/Si values of different areas of the wafer may be 1:0.9 to 1:1.1.

The C/Si value may be uniform from a first area of the wafer, where the hydrocarbon compounds are supplied, to a second area asymmetric to the first area.

In addition, the C/Si value may be uniform from the center of the wafer to the circumference of the wafer.

A ratio of a thickness difference of the silicon carbide epi layer between different areas of the wafer with respect to an average thickness of the silicon carbide epi layer disposed on the wafer may be 0.005 or less.

The silicon carbide epi layer disposed on the wafer may have a root mean square (RMS) roughness of 0.5 nm or less.

In another embodiment, a silicon carbide epi wafer includes a silicon carbide epi layer formed from a reactive gas comprising a plurality of hydrocarbon compounds, wherein the hydrocarbon compounds have different thermal decomposition rates.

The hydrocarbon compounds may include $C_3H_8$, $C_2H_4$, $C_2H_2$ and $CH_4$.

$C_3H_8$ may be thermally decomposed into $C_2H_4$, $C_3H_6$ or $C_2H_6$.

$CH_4$ may have a higher deposition ratio than $C_3H_8$ when a distance between the wafer and the gas source is greater than 100 mm.

$C_2H_4$ may have a higher deposition ratio than $C_3H_8$ when a distance between the wafer and the gas source is 100 mm or less.

A ratio of a thickness difference of the silicon carbide epi layer between different areas of the wafer with respect to an average thickness of the silicon carbide epi layer disposed on the wafer may be 0.005 or less.

The silicon carbide epi layer disposed on the wafer may have a root mean square (RMS) roughness of 0.5 nm or less.

In another embodiment, a method of manufacturing a silicon carbide epi wafer includes preparing a wafer, applying a reactive gas to the wafer, heating the reactive gas to prepare an intermediate compound, and growing the prepared intermediate compound into a silicon carbide epi layer on the wafer, wherein the reactive gas includes a plurality of hydrocarbon compounds.

The hydrocarbon compounds may have different thermal decomposition degrees.

The hydrocarbon compounds may include $C_3H_8$, and $C_2H_2$ or $C_2H_4$ when a distance from a point, where the reactive gas is supplied, to the wafer is 100 mm or less and a weight ratio of $C_3H_8$ to $C_2H_2$ or $C_2H_4$ may be 1:0.1 to 1:0.3.

The hydrocarbon compounds may include $C_3H_8$, $C_2H_2$ or $C_2H_4$, and $CH_4$ when the distance from the point, where the reactive gas is supplied, to the wafer is greater than 100 mm.

A weight ratio of $C_3H_8$ to $C_2H_2$ or $C_2H_4$ to $CH_4$ may be 1:0.1 to 0.3:0.2 to 0.4 when the distance between the wafer and the gas source is greater than 100 mm and is equal to or less than 150 mm.

A weight ratio of $C_3H_8$, to $C_2H_2$ or $C_2H_4$ to $CH_4$ may be 1:0.1 to 0.3:0.2 to 0.6 when the distance between the wafer and the gas source is greater than 150 mm.

Effects of the Embodiments

Embodiments provide a silicon carbide epi wafer and a method of manufacturing the same which can uniformly supply a carbon source and allow the carbon source to react, regardless of the position of the wafer, by using a plurality of hydrocarbon compounds as reactive gases, to improve uniformity of a silicon carbide epi layer formed on the wafer.

BEST MODE

Figure 1A:
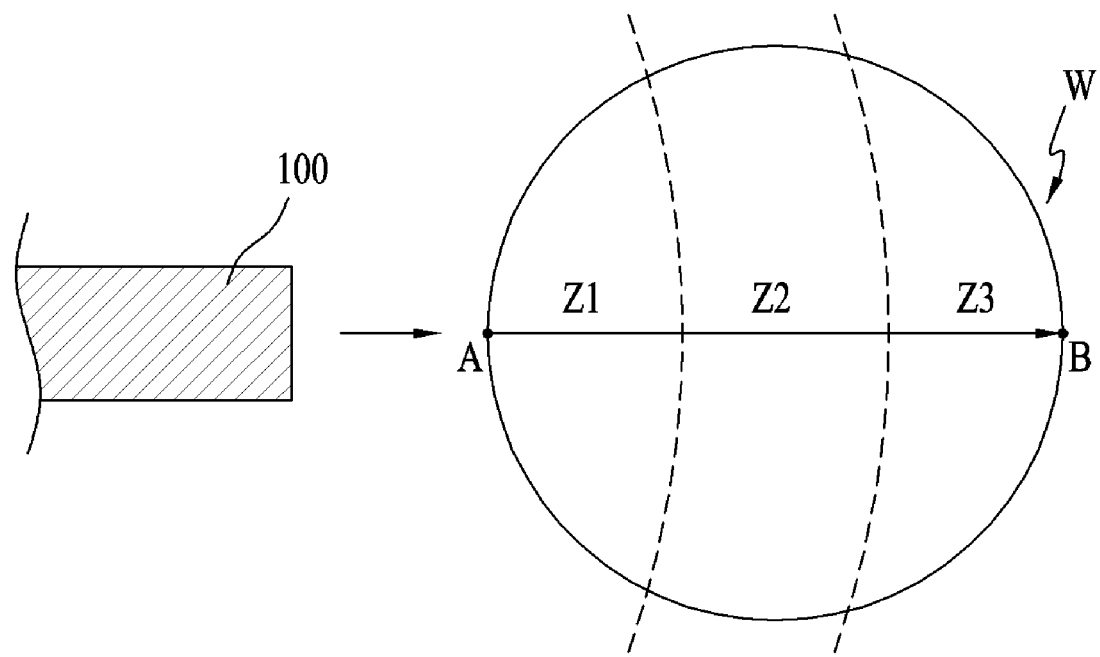
FIGS. 1A and 1B are schematic diagrams showing dispositions of a gas source and a wafer in a part of a device for depositing a silicon carbide epi layer.

Hereinafter, embodiments to implement the objects described above will be described with reference to the annexed drawings.

In description of the embodiments, it will be understood that when an element is referred to as being "on" or "under" another element, the term "on" or "under" means that the element is directly on or under the other element or the element is also indirectly on or under the other element via intervening elements interposed therebetween. It will also be understood that "on" or "under" is determined based on the drawings.

In addition, relative terms as "on/above/over" and "down/below/under" used below may be used solely to distinguish entities or elements from other entities or elements, while they neither necessarily require nor include any physical or logical relationship or order between such entities or elements.

In the drawings, the sizes of elements may be exaggerated, omitted or schematically illustrated for convenience of description and clarity. Further, the sizes of elements do not mean the actual sizes of the elements. Wherever possible, the same reference numbers will be used throughout the drawings to refer to the same parts.

The silicon carbide (SiC) epi wafer according to embodiments may include a silicon carbide epi layer which is formed from a reactive gas including a plurality of hydrocarbon compounds, and C/Si, which is an atomic ratio of carbon (C) to silicon (Si) of the formed silicon carbide epi layer, may be uniform throughout the wafer on which the epi layer is formed.

Figure 1B:
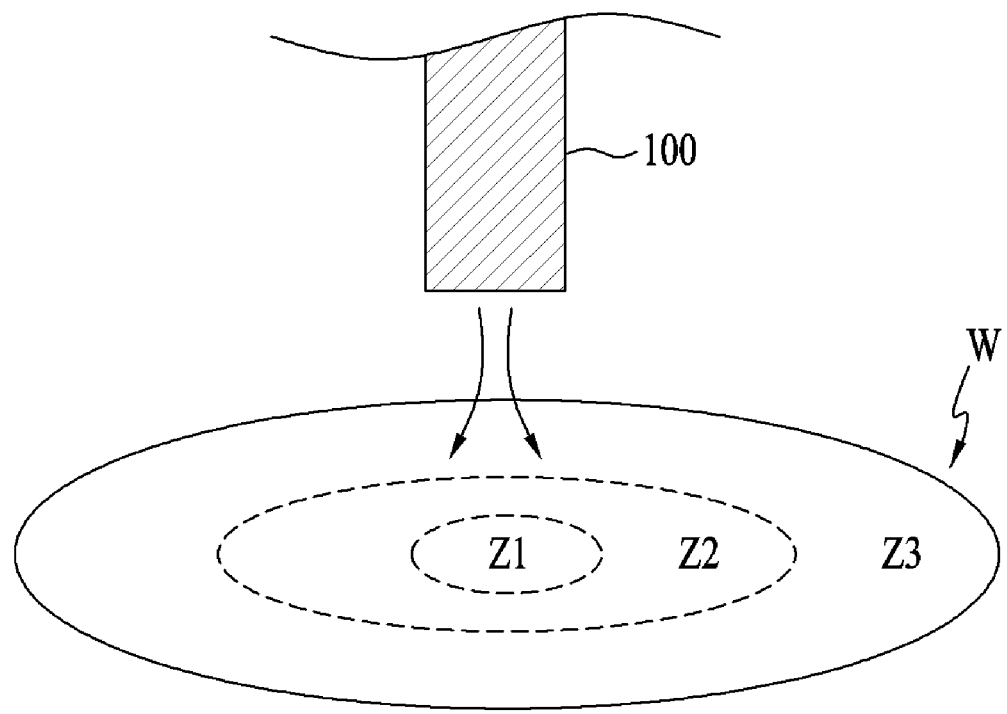

FIGS. 1A and 1B are schematic diagrams showing disposition forms of a gas source 100 and a wafer W in a device for depositing a silicon carbide epi layer.

FIG. 1A is a plan view illustrating an example in which the gas source 100 is placed at a side of the wafer W.

Referring to FIG. 1A, the gas source 100 may be disposed at the side of the wafer W. In this case, the reactive gas may be sequentially supplied from point A, one side of the wafer W, to point B, another side of the wafer W, that is, from Z1 to Z3.

FIG. 1B is a plan view illustrating an example in which the gas source 100 is placed on the top of the wafer W. In this case, the gas source 100 may be supplied to the top of the wafer W. The reactive gas may be supplied from the center of the wafer W, to the circumference of the wafer W, that is, from Z1 to Z3.

The reactive gas supplied from the gas source 100 shown in FIGS. 1A and 1B may be a source gas of carbon (C) and silicon (Si).

The source gas of carbon (C) may be a hydrocarbon compound. In an embodiment, the reactive gas serving as a carbon (C) source may be a plurality of hydrocarbon compounds including different types of hydrocarbon compounds.

The plurality of hydrocarbon compounds may include hydrocarbon compounds such as alkanes ($C_nH_{2n+2}$, in which $1 \leq n \leq 3$), alkenes ($C_nH_{2n}$, in which $2 \leq n \leq 3$) and alkynes ($C_nH_{2n-2}$, in which $2 \leq n \leq 3$).

For example, the plurality of hydrocarbon compounds may include, but are not limited to, $C_3H_8$ (propane), $C_2H_4$ (ethylene), $C_2H_2$ (ethyne) and $CH_4$ (methane).

The reactive gas used to form the silicon carbide epi wafer according to the embodiment may further include a source gas to supply silicon (Si).

The reactive gas serving as a silicon (Si) source may include a liquid or gas material. For example, the liquid material may include methyltrichlorosilane (MTS) and the gas material may include $SiH_4$ (silane), the embodiments are not limited thereto and the reactive gas may include a variety of materials containing silicon (Si).

The silicon carbide epi layer produced from a reactive gas serving as a source of carbon (C) and silicon (Si) may be formed on the wafer W.

The wafer W may be a silicon (Si) wafer and an intermediate compound produced by the supplied reactive gas is deposited on the silicon wafer to form a silicon carbide (SiC) epi layer.

The silicon carbide epi layer formed on the wafer may have a C/Si ratio between different positions, of 1:0.9 to 1:1.1.

In an embodiment, the C/Si value can be obtained by elementary analysis using secondary ion mass spectrometry (SIMS) and the elementary analysis method is not limited thereto. Any analysis equipment for quantitatively analyze the elements of the deposited silicon carbide thin film layer may be used.

Accordingly, the amounts of carbon (C) and silicon (Si) elements and the ratio (C/Si) thereof can be obtained by surface element analysis of the silicon carbide epi layer formed by deposition. In this manner, C/Si values can be obtained at different positions of the silicon carbide epi layer, for example, the difference in C/Si between the different positions may be 10% or less.

Regarding the silicon carbide epi wafer W of the embodiment shown in FIGS. 1A and 1B, C/Si of the closest area to the gas source 100 may be equal to C/Si of the farthest area from the gas source.

In the embodiment, C/Si may be uniform from the first point of the wafer where hydrocarbon compounds are supplied to the second point of the wafer asymmetric to the first point.

For example, referring to FIG. 1A, when the reactive gas is supplied to a side of the wafer, C/Si may be uniform between the point A, one side of the wafer, and the point B asymmetric to the point A, and may be uniform from the area Z1 closest to the reactive gas source to the area Z3 farthest from the reactive gas source.

In addition, in the embodiment of the silicon carbide epi wafer shown in the FIG. 1A, a ratio of C/Si of the first area Z1 to C/Si of the third area Z3 may range from 1:0.9 to 1:1.1.

In the embodiment, the C/Si of the silicon carbide epi wafer may be uniform from the center of the wafer to the circumference of the wafer.

Referring to FIG. 1B, C/Si of the silicon carbide epi layer may be uniform from the area Z1, the center of the wafer W adjacent to the reactive gas source 100 to the area Z3, the edge of the wafer W. In addition, the C/Si ratio of the center Z1 of the wafer W to the edge Z3 thereof may be 1:0.9 to 1:1.1.

Accordingly, the silicon carbide epi wafer exemplified in FIGS. 1A and 1B can have a uniform C/Si ratio of the silicon carbide epi layer formed on the wafer W, regardless of the distance from the gas source 100, by supplying a plurality of hydrocarbon compounds included in reactive gas.

In addition, in the silicon carbide epi wafer of the embodiment shown in FIGS. 1A and 1B, the thickness and roughness of the silicon carbide epi layer formed on the wafer W may be uniform, independent from relative distance between the reactive gas source 100 and the wafer W.

For example, in the silicon carbide epi wafer of the embodiment, a ratio of a thickness difference of the silicon carbide epi layer between different points of the wafer with respect to an average thickness of the silicon carbide epi layer may be 0.005 or less. That is, assuming that the average thickness of the formed silicon carbide epi layer is referred to as "ta", the thickness of the silicon carbide epi layer at one point on the wafer is referred to as "tx", and the thickness of the silicon carbide epi layer at another point on the wafer is referred to as "ty", $\{|tx-ty|/ta\} \leq \leq 0.005$ may be satisfied throughout the wafer. When the relation of (tx−ty) <0 is set, the equation of |tx−ty|=−(tx−ty) is satisfied and when the relation of (tx−ty)≥≥0 is set, the equation of |tx−ty|=(tx−ty) is satisfied.

The silicon carbide epi layer of the embodiment may have a root mean square (RMS) roughness of 0.5 nm or less. That is, the formed silicon carbide epi layer may have a standard deviation of roughness, corresponding to surface roughness of the silicon carbide epi layer, of 0.5 nm or less.

Accordingly, the silicon carbide epi wafer of the embodiment described above can impart to uniform C/Si, thickness and roughness to the silicon carbide epi layer by using a plurality of hydrocarbon compounds as reactive gases, thereby advantageously exhibiting uniform physical properties throughout the silicon carbide epi wafer and improving quality thereof.

Figure 2:
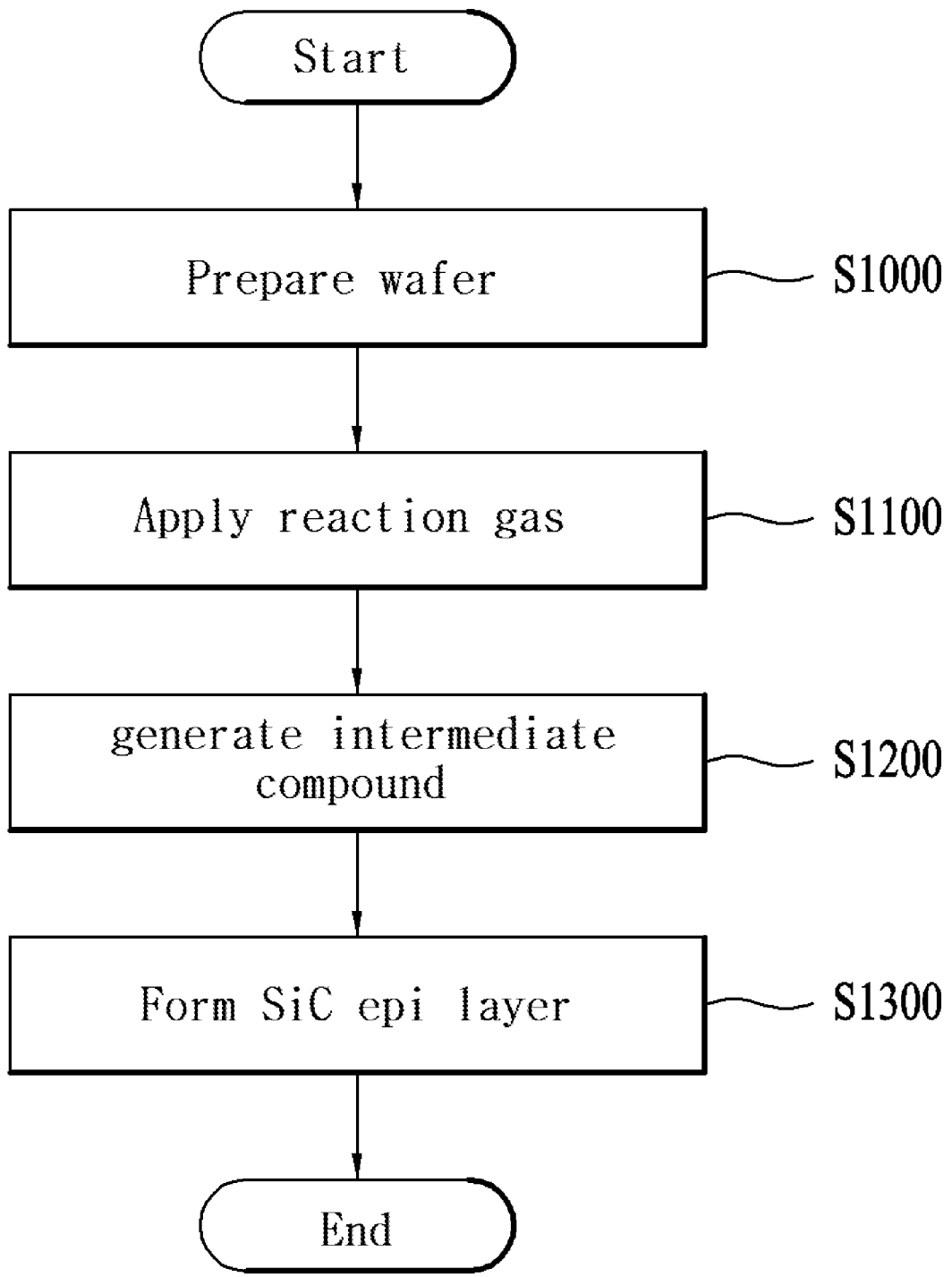
FIG. 2 is a flowchart illustrating a method of manufacturing a silicon carbide epi wafer according to an embodiment.

FIG. 2 is a flowchart illustrating a method of manufacturing a silicon carbide epi wafer according to an embodiment.

Referring to FIG. 2, the method of manufacturing a silicon carbide epi wafer according to the embodiment includes preparing a wafer (S1000), applying a reactive gas to the wafer (S1100), heating the reactive gas to prepare an intermediate compound (S1200) and growing the prepared intermediate compound into a silicon carbide epi layer on the wafer (S1300), wherein the reactive gas may include a plurality of hydrocarbon compounds.

Figure 3:
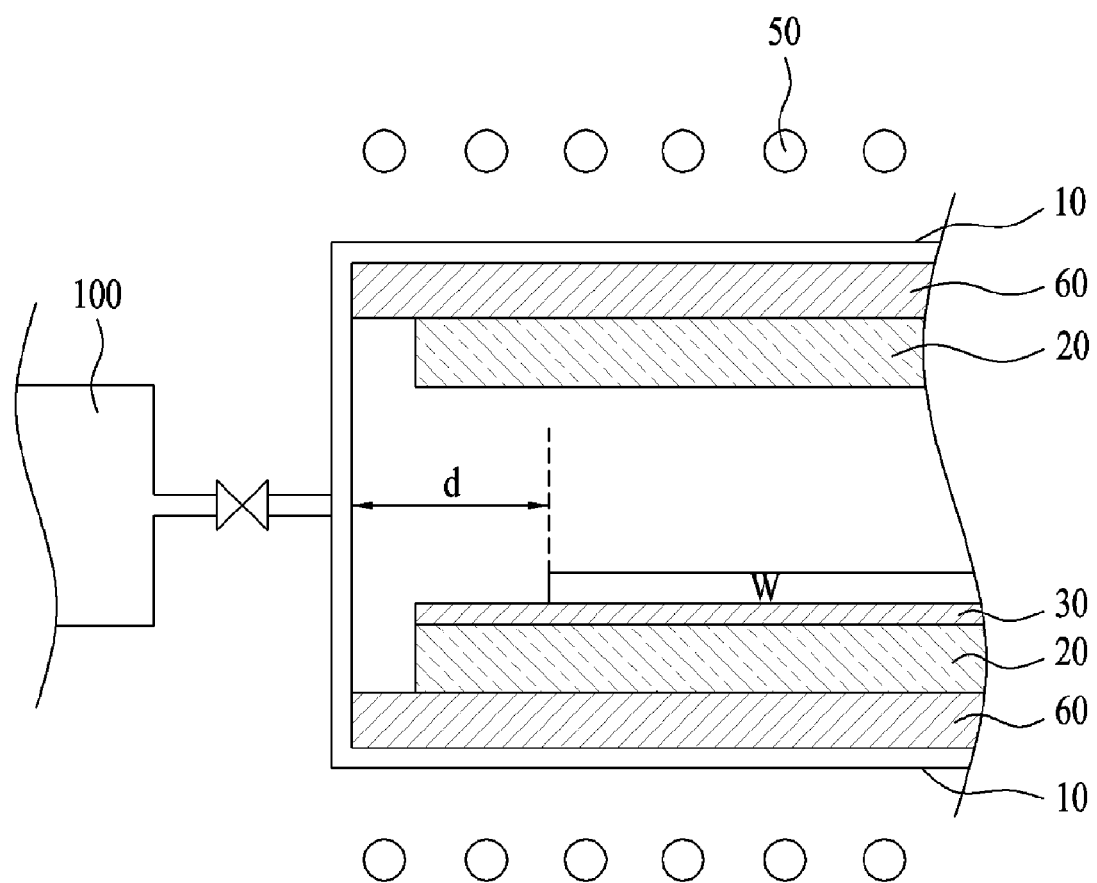
FIG. 3 is a view illustrating a part of a silicon carbide deposition device.

The method of manufacturing a silicon carbide epi wafer according to the embodiment may be carried out in a deposition device shown in FIG. 3.

FIG. 3 is a cross-sectional view illustrating a part of the deposition device connected to the gas source 100. The deposition device of FIG. 3 may include a chamber 10, a heater 50 to heat the inside of the chamber 10, a susceptor 20 and a substrate holder 30 disposed in the susceptor.

The chamber 10 may have a cylindrical or square box shape, may include an area where a substrate W is disposed therein and may further include a gas discharge part at a side surface thereof, although not shown.

The chamber 10 functions to prevent permeation of exterior gas and to maintain vacuum degree in the deposition device, and may be made of a material including quartz with high mechanical strength and excellent chemical durability.

The heater 50 may be disposed at the outside of the chamber 10. The heater 50 may be a resistive heating element which generates heat upon receiving power and may be spaced by a predetermined distance to uniformly heat the substrate W.

The heater 50 may have a wire shape so that it can be disposed in a predetermined pattern outside the chamber. For example, the heater 50 may include a filament, a coil, a carbon wire or the like.

An insulator 60 may be further disposed in the chamber 10, which serves to conserve heat within the chamber 10. The insulator 60 may be made of a material which is chemically stable without being thermally deformed by heat generated from the heater 50. For example, the insulator 60 may include a nitride ceramic, a carbide ceramic or a graphite material.

The susceptor 20 may be disposed on the insulator 60 in the chamber 10. The susceptor 20 may include a graphite material with high heat resistance and excellent workability to exhibit stability even under high-temperature conditions.

The substrate holder 30 may be disposed in the susceptor 20. In the deposition device of FIG. 3, the substrate W where deposits are formed or epitaxial growth occurs may be disposed on the substrate holder 30 of the susceptor 20 and the substrate holder 30 may be made of a material such as silicon carbide or graphite.

Like the deposition device shown in FIG. 1A, the deposition device shown in FIG. 3 corresponds to a case in which the gas source 100 is disposed at a side of the wafer, and the deposition device used is not limited thereto. Although not shown, like the deposition device of FIG. 1B, in the deposition device, the gas source 100 may be disposed outside the chamber 10 such that it faces an upper surface of the wafer W.

Referring to FIG. 3, the wafer W may be disposed at a side spaced from the gas source 100 by the distance d and the gas source 100 may be spaced from the upper surface of the wafer W by the distance d, although not shown.

In the method of manufacturing the silicon carbide epi wafer according to the embodiment, in the preparing a wafer (S1000), the wafer W may be disposed in the susceptor 20 placed in the chamber 10.

Then, in the applying a reactive gas to the wafer W (S1100), a plurality of hydrocarbon compounds may be applied as the reactive gas.

The reactive gas may be source gas of carbon (C) and silicon (Si), like the embodiment of the silicon carbide epi wafer described above, and may include a hydrocarbon compound serving as a carbon source (C source), and $SiH_4$ (silane) or methyltrichlorosilane (MTS) serving as a silicon source (Si source).

The hydrocarbon compound used as the reactive gas may include all of the hydrocarbon compounds described above.

Then, the method may include heating the supplied reactive gas to form an intermediate compound (S1200).

The heating the reactive gas may be carried out at a temperature allowing for ionization of the reactive gas, for example, at a process temperature of 1500° C. to 1700° C.

The intermediate compound produced by heating the reactive gas may be a radical form of reactive gas including carbon (C) or silicon (Si), and may be $CH_X\cdot(1 \leq X<4)$ or $SiCl_X\cdot(1 \leq X<4)$, and may include $CH_3\cdot$, $SiCl\cdot$, $SiHCl\cdot$, $SiHCl_2\cdot$ or the like.

Then, the intermediate compound may form a silicon carbide epi layer on the wafer (S1300).

The wafer for growth of the silicon carbide epi layer may be a silicon (Si) wafer and the wafer may be disposed in the deposition device.

In the method of manufacturing the silicon carbide epi wafer, the reactive gas supplied to the gas source 100 may include a plurality of hydrocarbon compounds which may have different thermal decomposition degrees.

For example, the hydrocarbon compounds may include $C_3H_8$, $C_2H_4$, $C_2H_2$ and $CH_4$ which may have different thermal decomposition degrees.

Figure 4:
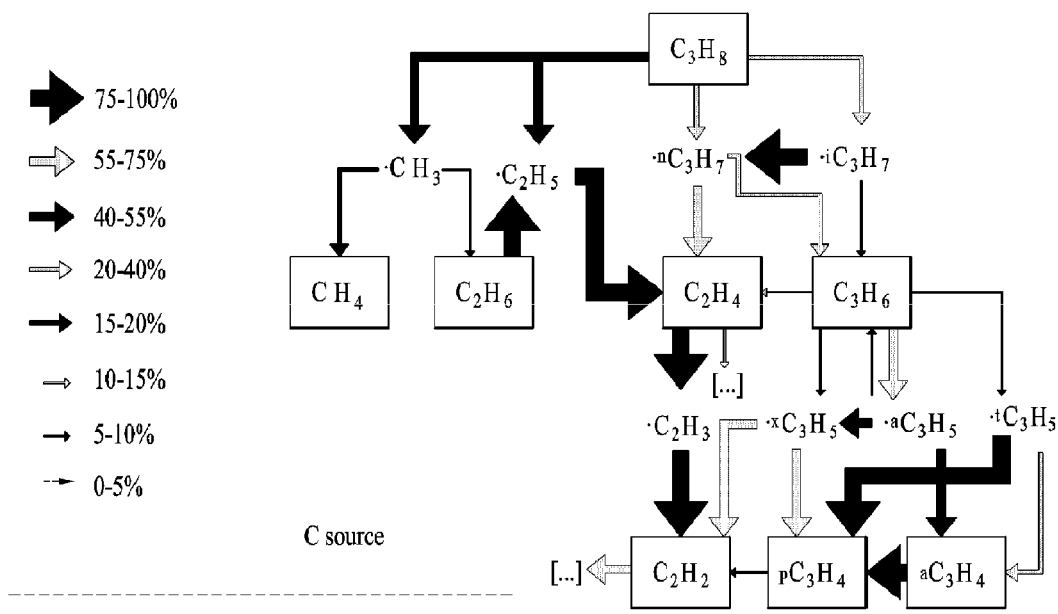
FIG. 4 is a view illustrating thermal decomposition of a hydrocarbon compound.

FIG. 4 shows an example of thermal decomposition of $C_3H_8$ (propane), one hydrocarbon compound.

The thermal decomposition process view shown in FIG. 4 briefly illustrates thermal decomposition behaviors of $C_3H_8$ at a temperature of about 850° C. $C_3H_8$ may be decomposed into $CH_4$, $C_2H_6$, $C_2H_4$, or $C_3H_6$ while carbon and hydrogen are split at a high temperature.

Referring to FIG. 4, $C_3H_8$ may be thermally decomposed into $C_2H_4$, $C_3H_6$, or $C_2H_6$, and the final product (step) in thermal decomposition process view may be $C_2H_2$.

That is, referring to the $C_3H_8$ thermal decomposition process view of FIG. 4, among the hydrocarbon compounds shown in the thermal decomposition process view, $C_2H_2$, which is the product of the last (lowermost) step, has the highest thermal decomposition rate and $C_3H_8$, which is the product of the earliest (uppermost) step, has the lowest thermal decomposition rate.

Accordingly, the thermal decomposition rate may decrease in order of $C_2H_2 > C_2H_4 \geq \geq C_3H_6 \geq \geq C_2H_6 \geq C_3H_8$ and may be varied, taking into consideration the number of carbons (C) and the bonding form of carbon (C) and hydrogen (H).

$CH_4$ is a saturated hydrocarbon compound having a stable structure and may have a low thermal decomposition rate due to excellent thermal stability as compared to other hydrocarbon compounds used as reactive gases.

Accordingly, in the method of manufacturing the silicon carbide epi wafer according to the embodiment, the used hydrocarbon compounds may have different thermal decomposition rates and a combination of hydrocarbon compounds having different thermal decomposition rates may be used.

For example, when a combination of $C_2H_2$, $C_3H_8$ and $CH_4$ is supplied as reactive gas, during high-temperature deposition, $C_2H_2$ may be first decomposed and become a carbon (C) source, and then $C_3H_8$, and finally, $CH_4$ may be decomposed and deposited on the wafer.

Figure 5:
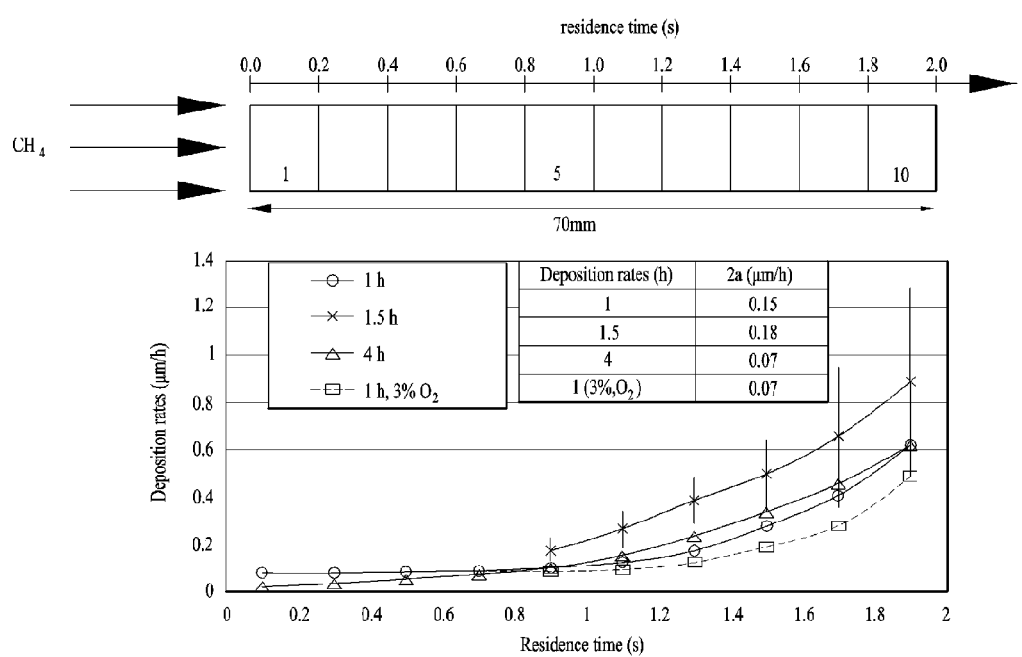
FIG. 5 shows decomposition efficiency of a hydrocarbon compound depending on the distance of a gas source.

FIG. 5 shows a deposition ratio of carbon (C) on the wafer depending on the distance from the area, where gas is supplied, to the wafer W when $CH_4$ (methane) is supplied as reactive gas.

In the graph of FIG. 5, the X-axis represents a residence time during which $CH_4$ stays in the deposition device when $CH_4$ gas is supplied, which may indicate a relative distance from the source gas source.

For example, as the residence time lengthens, the distance from the gas source increases. In addition, exposure time to high-temperature process conditions increases.

The Y-axis represents deposition rate, which corresponds to the thickness of carbon (C) decomposed from the $CH_4$ gas and deposited on the wafer surface.

Referring to FIG. 5, as residence time lengthens when supplying $CH_4$, that is, as the distance from the gas source increases, deposition rate gradually increases. In particular, at a residence time of 1(s) or higher, the deposition rate rapidly increases.

For example, supposing that the residence time of 2(s) is plotted at the point spaced by the distance of 70 mm from the source gas source, the deposition rate of carbon (C) may significantly increase from the residence time of 1(s), that is, the point spaced by the distance of 35 mm or more from the source gas source.

In addition, although not shown, the point spaced by the distance of 150 mm or more from the source gas supply point may have a 10-fold or more higher decomposition rate of forming a silicon carbide layer from decomposed $CH_4$ gas than the point spaced by the distance of 35 mm or more from the source gas supply point.

That is, it can be seen that the deposition rate and the amount of carbon (C) deposited may be varied depending on time of exposure to the high-temperature process.

Figure 6:
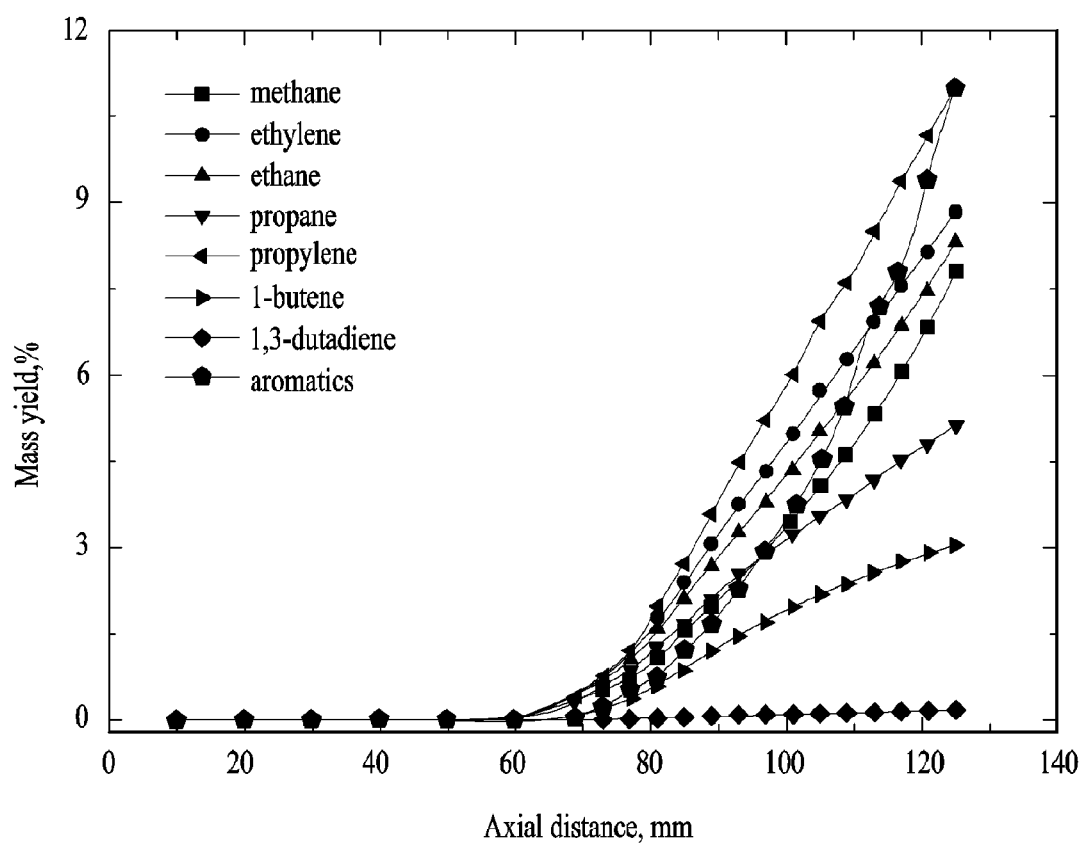
FIG. 6 shows thermal decomposition efficiency of the hydrocarbon compound.

Meanwhile, FIG. 6 shows thermal decomposition efficiency of a variety of hydrocarbon compounds.

In FIG. 6, the X-axis represents an axial distance meaning the distance from the point at which the reactive gas as a source gas is supplied and the Y-axis represents decomposition efficiency, that is, a ratio of carbon (C) decomposed from the hydrocarbon compound and then deposited on the wafer, to the supplied hydrocarbon compound (mass yield).

As can be seen from the graph of FIG. 6, most of a plurality of hydrocarbon compounds exhibit considerably increased decomposition efficiency at a distance of 70 mm or more from the gas source.

Referring to FIG. 6, among the hydrocarbon compounds, $C_2H_4$ having a higher decomposition rate exhibits excellent decomposition efficiency even in the close area spaced by the distance of 100 mm or less from the gas source and thus has a higher deposition ratio than $C_3H_8$.

On the other hand, $CH_4$ having a lower decomposition rate has a higher decomposition efficiency than $C_3H_8$ as compared to the case in which the distance from the gas source is greater than 100 mm.

In addition, although not shown in the graph, $C_2H_2$ having a high thermal decomposition rate also exhibits a high decomposition efficiency in the area spaced by the distance of 100 mm or less from the gas source, like $C_2H_4$.

Accordingly, the method of manufacturing the silicon carbide epi wafer according to the embodiment can sequentially receive carbon (C) sources from a plurality of hydrocarbon compounds by using a combination of hydrocarbon compounds having different thermal decomposition degrees, thereby making the amount of carbon (C) deposited on the wafer uniform, regardless of the distance between the wafer and the reactive gas source.

For example, when hydrocarbon compounds having different thermal decomposition degrees are simultaneously supplied, hydrocarbon gas having a high thermal decomposition rate such as $C_2H_4$ or $C_2H_2$ may be decomposed and then deposited in the area relatively close to the gas source, as a predetermined time passes, that is, $C_3H_8$ may be decomposed and then deposited in the area spaced by a predetermined distance from the gas source, and $CH_4$ having a low thermal decomposition rate due to having the highest thermal stability may finally be thermally decomposed into a carbon (C) source gas and then deposited.

Accordingly, in the embodiment relating to the method of manufacturing the silicon carbide epi wafer, when $C_3H_8$ is used as a main carbon source, $C_2H_2$ having a higher decomposition rate than $C_3H_8$ and $CH_4$ having a lower decomposition rate than $C_3H_8$ may be used in combination.

In this case, $C_2H_2$, $C_3H_8$ and $CH_4$ are sequentially thermally decomposed and become a carbon (C) source in the area to which reactive gas is supplied due to difference in thermal decomposition rate. In conclusion, regardless of the distance from the reactive gas source, carbon (C) is uniformly supplied and deposited throughout the wafer.

In the method of manufacturing the silicon carbide epi wafer according to the embodiment, when the distance from the area, where reactive gas is supplied, to the wafer is 100 mm or less, the plurality of hydrocarbon compounds may include $C_3H_8$ and $C_2H_2$, or $C_3H_8$ and $C_2H_4$.

A weight ratio of supplied $C_3H_8$ to $C_2H_2$ gas may be 1:0.1 to 1:0.3 and a weight ratio of $C_3H_8$ to $C_2H_4$ may be 1:0.1 to 1:0.3.

When the hydrocarbon compound is supplied as reactive gas, $C_2H_2$ or $C_2H_4$ having a relatively high thermal decomposition rate is deposited in the area close to the gas source, while $C_3H_8$ having a lower thermal decomposition rate than $C_2H_2$ or $C_2H_4$ is deposited in the area far from the gas source.

When the distance from the area, where reactive gas is supplied, to the wafer is greater than 100 mm, the hydrocarbon compounds may include $C_3H_8$, $C_2H_2$ or $C_2H_4$ and $CH_4$.

When the distance from the area, where reactive gas is supplied, to the wafer is greater than 100 mm and is equal to or less than 150 mm, the weight ratio of $C_3H_8$, $C_2H_2$ or $C_2H_4$ to $CH_4$ may be $C_3H_8$:($C_2H_2$ or $C_2H_4$):$CH_4$=1:0.1 to 0.3:0.2 to 0.4, and when the distance is greater than 150 mm, the weight ratio of $C_3H_8$, $C_2H_2$ or $C_2H_4$ to $CH_4$ may be $C_3H_8$: ($C_2H_2$ or $C_2H_4$):$CH_4$=1:0.1 to 0.3:0.2 to 0.6.

For example, when a hydrocarbon compound is supplied as reactive gas, depending on the kind of the hydrocarbon compound used, a compound having a high thermal decomposition rate is completely thermally decomposed in an early deposition stage to form a silicon carbide epi layer. On the other hand, a compound having a low thermal decomposition rate is not thermally decomposed in an early deposition stage and the ratio of carbon (C) deposited on the wafer increases as the distance from the reactive gas source increases.

Accordingly, when a hydrocarbon compound is used as a reactive gas, the amount of carbon deposited may be changed depending on the distance from the area where reactive gas is supplied, thus resulting in non-uniform C/Si throughout the wafer.

However, when a combination of a plurality of hydrocarbon compounds is supplied as reactive gas, like the embodiment, the hydrocarbons have different thermal decomposition rates and are thus sequentially decomposed and deposited on the wafer in a decreasing order of thermal decomposition rate. In addition, by simultaneously supplying a hydrocarbon compound having a high thermal decomposition rate with a hydrocarbon compound having a low thermal decomposition rate, a carbon (C) source can be sufficiently supplied to the area of wafer farther from the gas source as well.

The weight ratio between the hydrocarbon compounds may be changed depending on relative distance from the gas source. For example, as the distance between the gas source and the wafer on which carbon is deposited decreases, the proportion of $C_2H_2$ or $C_2H_4$ having a high thermal decomposition rate may increase and, as the distance between the gas source and the wafer increases, the ratio of $CH_4$ having a low thermal decomposition rate increases.

In the silicon carbide epi wafer and the method of manufacturing the same according to the embodiment, regardless of the position where reactive gas is supplied, the carbon (C) source is uniformly supplied to form a silicon carbide (SiC) layer on the wafer, so that C/Si can be uniform throughout the wafer and the thickness and the roughness of the silicon carbide epi layer can thus be uniform.

Although the preferred embodiments of the present disclosure have been disclosed for illustrative purposes, those skilled in the art will appreciate that various modifications, additions and substitutions are possible, without departing from the scope and spirit of the disclosure as disclosed in the accompanying claims. For example, constituent elements specified in the embodiments can be implemented in modified forms. The differences related to such modifications and applications should be construed as falling within the scope of the present disclosure.

Mode for Invention

Mode for Invention has been sufficiently described in Best Mode given above.

INDUSTRIAL APPLICABILITY

The silicon carbide epi wafer according to embodiments may be applied to a variety of fields. For example, the silicon carbide epi wafer may be used as a substrate for electronic devices.

The invention claimed is:

1. A silicon carbide epi wafer comprising a silicon carbide epi layer formed from a reactive gas comprising a plurality of hydrocarbon compounds,
   wherein the plurality of hydrocarbon compounds have different thermal decomposition degrees,
   wherein at least one of the plurality of hydrocarbon compounds has a different deposition ratio from the rest of the plurality of hydrocarbon compounds depending on a distance between the wafer and a gas source,
   wherein a ratio of a thickness difference of the silicon carbide epi layer between different areas of the wafer with respect to an average thickness of the silicon carbide epi layer disposed on the wafer is 0.005 or less, and
   wherein the silicon carbide epi layer disposed on the wafer has a root mean square (RMS) roughness of 0.5 nm or less.

2. The silicon carbide epi wafer according to claim 1, wherein the hydrocarbon compounds comprise $C_3H_8$, $C_2H_4$, $C_2H_2$ and $CH_4$.

3. The silicon carbide epi wafer according to claim 2, wherein $C_3H_8$ is thermally decomposed into $C_2H_4$, $C_3H_6$ or $C_2H_6$.

4. The silicon carbide epi wafer according to claim 3, wherein $C_2H_4$ has a higher deposition ratio than $C_3H_8$ when the distance between the wafer and the gas source is 100 mm or less.

5. The silicon carbide epi wafer according to claim 2, wherein $CH_4$ has a higher deposition ratio than $C_3H_8$ when the distance between the wafer and the gas source is greater than 100 mm.

6. A method of manufacturing a silicon carbide epi wafer comprising:
   preparing a wafer;
   applying a reactive gas to the wafer;
   heating the reactive gas to prepare an intermediate compound; and
   growing the prepared intermediate compound into a silicon carbide epi layer on the wafer,
   wherein the reactive gas comprises a plurality of hydrocarbon compounds,
   wherein the plurality of hydrocarbon compounds are determined based on a distance from a point where the reactive gas is supplied to the wafer, wherein when the distance is 100 mm or less, the hydrocarbon compounds comprise $C_2H_8$, and $C_2H_2$ or $C_2H_4$ and a weight ratio of $C_3H_8$ to $C_2H_2$ or $C_2H_4$ is 1:0.1 to 1:0.3;

wherein when the distance is greater than 100 mm and is equal to or less than 150 mm, the hydrocarbon compounds comprise $C_3H_8$, $C_2H_2$ or $CH_4$, and a weight ratio of $C_3H_8$ to $C_2H_2$ or $C_2H_4$ to $CH_4$ is 1:0.1 to 0.3:0.2 to 0.4; and wherein when the distance is greater than 150 mm. the hydrocarbon compounds comprise $C_3H_8$, $C_2H_2$ or $C_2H_4$, and $CH_4$, and the weight ratio of $C_3H_8$ to $C_2H_2$ or $C_2H_4$ to $CH_4$ is 1:0.1 to 0.3:0.2 to 0.6.

7. The method according to claim 6, wherein the hydrocarbon compounds have different thermal decomposition degrees.

* * * * *